United States Patent [19]

Bomchil et al.

[11] 4,124,474
[45] Nov. 7, 1978

[54] METHOD AND APPARATUS FOR CONTROLLING THE DEPOSITION OF FILMS BY REACTIVE SPUTTERING

[75] Inventors: Guillermo Bomchil, Seyssinet; François Buiguez, Pau; Sylvie Galzin, Chambery; Alain Monfret, Meudon; Louise Peccoud, Claix, all of France

[73] Assignee: Commissariat a l'Energie Atomique, Paris, France

[21] Appl. No.: 848,133

[22] Filed: Nov. 3, 1977

[30] Foreign Application Priority Data

Nov. 15, 1976 [FR] France ............................. 76 34840

[51] Int. Cl.² ............................................. C23C 15/00
[52] U.S. Cl. ............................. 204/192 R; 204/192 P; 204/298
[58] Field of Search ............ 204/192 R, 192 C, 192 P, 204/192 D, 298

[56] References Cited

U.S. PATENT DOCUMENTS

| 3,761,375 | 9/1973 | Pierce et al. ....................... 204/192 |
| 3,907,660 | 9/1975 | Gillery ............................... 204/298 |
| 3,962,062 | 6/1976 | Ingrey ................................. 204/192 |
| 4,043,889 | 8/1977 | Kochel ........................... 204/192 R |
| 4,065,600 | 12/1977 | King et al. ........................ 428/432 |

FOREIGN PATENT DOCUMENTS

| 2,422,808 | 11/1975 | Fed. Rep. of Germany ........... 204/298 |
| 1,406,093 | 6/1965 | France. |
| 2,232,832 | 1/1975 | France. |
| 367,074 | 2/1932 | United Kingdom .................... 204/298 |

Primary Examiner—John H. Mack
Assistant Examiner—Aaron Weisstuch
Attorney, Agent, or Firm—McNenny, Pearne, Gordon, Gail, Dickinson & Schiller

[57] ABSTRACT

The method consists in establishing the ion bombardment parameters, in varying a regulation parameter in order to initiate deposition, in measuring at each instant the total pressure drop within the vacuum chamber with respect to the initial pressure and in controlling the total pressure drop by controllably varying the regulation parameter.

10 Claims, 5 Drawing Figures

METHOD AND APPARATUS FOR CONTROLLING THE DEPOSITION OF FILMS BY REACTIVE SPUTTERING

This invention relates to a method for controlling the deposition of films by reactive sputtering and to a reactive sputtering device for carrying out said method.

The method of deposition known as reactive sputtering is particularly well suited to the formation of thin films of compounds such as oxides, nitrides, sulphides and the like on a wide range of different substrates (such as glass, insulating semiconductors and so forth).

The method consists in sputtering a target comprising a predetermined chemical substance such as a metal, for example, under the impact of ions in a gas mixture containing a reactive gas such as oxygen or nitrogen, for example, and usually a neutral gas such as argon. The atoms which are dislodged from the target combine with the reactive gas to produce the desired compound which is deposited on the substrate.

There already exist a number of different types of devices for carrying out this method of deposition, viz:

the devices of the "diode" type in which the ionized gas or plasma is produced by applying a direct-current voltage between a plate (anode) and the target; this voltage also produces the electric field for accelerating the ions;

the devices of the "triode" type in which the plasma is produced by applying a D.C. voltage between an electron-emitting filament and an anode; the target which constitutes the third electrode is brought to a potential which produces the ion-acceleration field;

the so-called "ion gun" devices in which the plasma is produced within a chamber which is different from the sputtering enclosure; the ions are extracted from said ionization chamber by means of grids brought to suitable potentials; they are then projected onto a target which is at ground potential, for example;

finally, the so-called "radio-frequency" devices which can have either "diode" or "triode" configurations; the plasma is produced within the sputtering enclosure from atoms of the gas mixture by applying an electromagnetic radio-frequency field to said mixture either by inductive or capacitive coupling; acceleration of the ions results either from this field or from a D.C. voltage applied to the target.

Some of these devices are also provided with one or a number of magnetic coils which are capable of producing a magnetic field within the enclosure. Said field serves to confine the plasma and/or to act upon the probability of collision between particles.

The method of reactive sputtering constitutes a useful improvement in the method of direct sputtering. In the latter, a target constituted by the compound to be deposited itself is in fact sputtered, with the result that the nature of the deposited film layer is predetermined by the nature of the target.

On the contrary, in the reactive sputtering process, a wide range of target compositions (including, for example, simple metals, binary alloys, ternary alloys and so on) and reactive gases can readily be contemplated. It is also possible to obtain compounds as different from each other as oxides, nitrides, carbides, borides, silicides and so on without entailing any need to prepare many different types of targets.

Reactive sputtering also makes it possible to control the purity of deposited films by controlling the purity of the target and of the reactive gas and the composition of the deposited films even if they are thermally unstable by virtue of the fact that it is possible to operate at low temperature (distinctly below 200° C.), which is not the case with the alternative technique of vacuum evaporation.

However, the reaction mechanisms between sputtered atoms and reactive gases are still incompletely understood and the methods of deposition have low reproducibility; the practical application of these latter calls for a long study of experimental conditions and for very careful investigation of all the parameters which are liable to exert an influence on the nature of the deposits.

Many authors have devoted experimental studies to deposition by reactive sputtering and have endeavored to explain the mechanism of this process as follows: if the partial pressure of the reactive gas in the mixture introduced into a given reactive sputtering device is caused to vary whilst all the other parameters of ion bombardment of the target are fixed (especially the total pressure of the gas mixture and the parameters which govern sputtering of the target such as the potential of said target), an abrupt drop in the sputtering rate is observed below a critical partial pressure; furthermore, a study of the deposited films reveals the existence of two types of deposit: in the case of a partial pressure of reactive gas which is higher than the critical value, the film is in fact a compound of the substance which constitutes the target and the reactive gas and this compound is stoichiometric. In the case of a partial pressure which is below this critical value, the film is essentially formed by the substance which constitutes the target and may also contain dissolved reactive gas and/or a small proportion of the desired compound.

The methods which are at present employed for the purpose of forming deposits therefore consist in creating a vacuum within the sputtering chamber in order to establish the residual pressure at a very low value $p_o$ with respect to the value of the critical partial pressure $p_{pc}$, in determining all the parameters for producing the plasma and accelerating the ions towards the target (in a device of the triode type, for example, the filament heating voltage, the anode-filament voltage, the target potential and the target current); in varying the composition of the gas introduced into the sputtering chamber in such a manner as to ensure that the partial pressure of reactive gas $p_p$ is higher than the critical value $p_{pc}$. The operation just mentioned is carried out by controlling the two main flow rates, namely the flow rate of reactive gas and the flow rate of neutral gas; adjustment of these two flow rates must clearly be such that the total pressure within the chamber ensures creation and maintenance of a plasma.

The operating parameters of the sputtering process, namely the parameters of bombardment of the target, are very numerous. They include pressure parameters, namely the residual pressure $p_O$, the total deposition pressure $p_T$, the partial pressures of the components of the gas mixture, or "electrical" parameters for controlling sputtering of the target, namely the filament heating voltage, the filament-cathode voltage, the target potential, the target current and the magnetic field intensity, for example. Simultaneous control of these parameters and of their stability is difficult if not actually impossible; it also proves insufficient since the nature of the deposited films is further dependent on the composition of the residual gas and of the gas adsorbed on the chamber walls (these data being practically impossible to check) and on the nature and proportion of the ions in the plasma, therefore on the decomposition of the gas introduced.

It is therefore not possible by means of the methods employed at the present time either to obtain reproducible deposits or to control the stoichiometry of the films and the rate of deposition.

The aim of the present invention is to overcome these disadvantages.

The invention accordingly relates to a method for controlling the deposition of thin film layers comprising a compound of a chemical substance C and a reactive gas on a substrate, said deposition being of the type which consists in placing within a chamber said substrate, a gas mixture containing said reactive gas and a target containing said substance C, producing a gas plasma containing ions and applying an electric field to said ions which are thus caused to bombard said target and to sputter said substance C so that the sputtered particles of substance C combine with said reactive gas to form said compound. The method of the invention essentially consists in establishing all the bombardment parameters with the exception of one of the parameters governing the bombardment of the target by the ions said one parameter being termed a "regulation parameter", in varying said regulation parameter in order to initiate the deposition process, in measuring at each instant the total pressure drop within the chamber with respect to the initial pressure and in controlling said total pressure drop by controllably varying said regulation parameter.

The invention is also directed to a reactive sputtering device for carrying out the method of control hereinabove defined. The device essentially comprises means for measuring the total pressure within the chamber and means for controlling said total pressure in dependence on a reference value by producing action on one of the parameters governing the bombardment of the target by the plasma ions.

A more complete understanding of the invention will be gained from the following description in which a number of embodiments are given by way of example without any limitation being implied, reference being made to the accompanying drawings, wherein:

Figure 1:
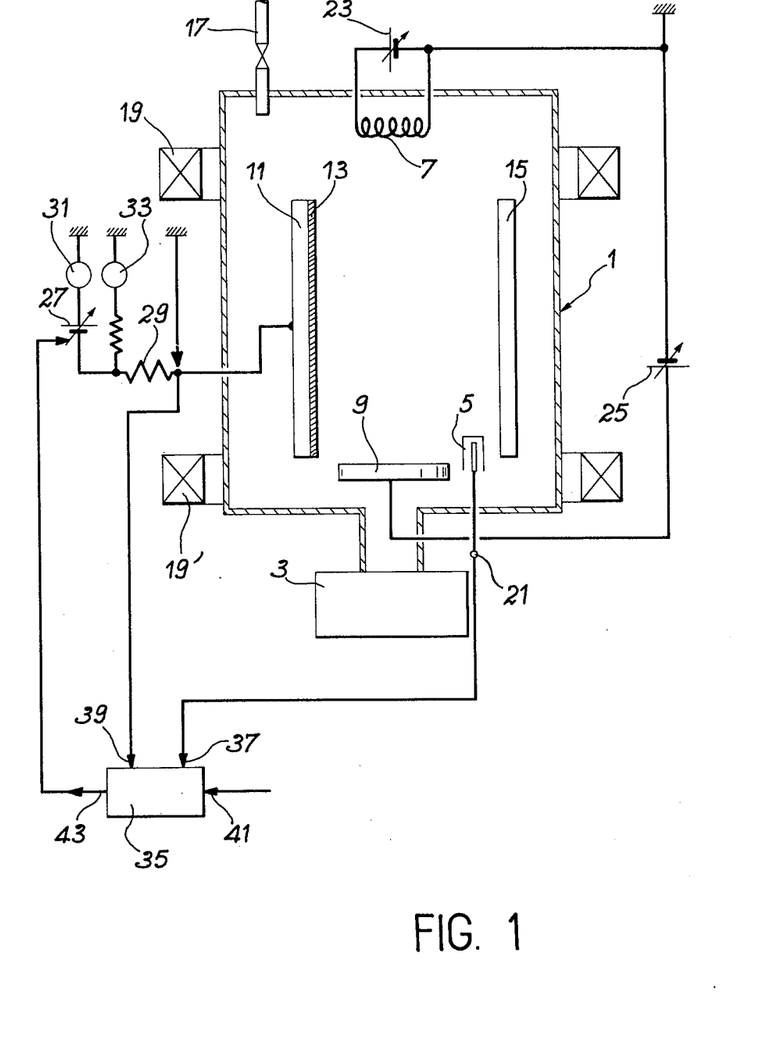
FIG. 1 illustrates a triode-type reactive sputtering device and the modifications made as a result of application of the invention.

The triode type device which is illustrated in FIG. 1 serves to carry out reactive sputtering and comprises a vacuum chamber 1. A vacuum pump system 3 which is illustrated diagrammatically serves to attain within said chamber a minimum pressure below $4 \times 10^{-7}$ torr. The system is composed of a dry primary pump which is a graphite-vane pump, a sorption pump cooled by liquid nitrogen and a liquid-helium cryogenic secondary pump. This system has the advantage of producing very clean vacua.

The pressure within the chamber is measured by means of a high-performance gage 5, namely a "high-pressure gage" of the type described, for example, in French patent Application No. 69 11991, which offers the advantage of accuracy and sensitivity and is capable of operating in the presence of the plasma which is formed during operation.

Provision is made within the chamber for:
an emissive tungsten filament 7,
a circular anode 9 of copper having a diameter of 60 mm and placed opposite to the filament at a distance of 25 cm,
a flat and rectangular cathode 11 of copper having dimensions of 200 mm by 60 mm,
a metallic target 13 constituted by an indium-tin alloy having the same dimensions as the cathode and made integral therewith,
a flat substrate-holder 15 having dimensions of 210 mm by 70 mm and placed in oppositely-facing relation to the cathode at a distance which can be adjusted between 5 and 7 cm.

The vacuum chamber 1 is fitted with a supply 17 of argon-oxygen gas mixture. Micrometric valves (not shown) serve to regulate the quantities and proportions of the two gases.

Two magnetic coils 19 and 19' in the Helmholtz position which are supplied in series from a direct-current source (not shown) surround the vacuum chamber 1 and produce a uniform magnetic induction within the zone located between the target 13 and the substrate-holder 15.

A number of different elements located within the vacuum chamber are connected to the exterior by means of electric leads passed through insulating bushings fitted in the wall. Thus the pressure gage 5 delivers its measuring signal at an output 21. The two terminals of the emissive filament 7 are connected to the two terminals of a D.C. voltage source 23, one of the terminals of which is connected to the frame earthed or chassis ground of the unit. The anode 9 is brought to a direct-current voltage $V_A$ with respect to ground by means of a D.C. voltage source 25. The cathode 11 is brought to the potential $V_k$ by the D.C. voltage source 27 for delivering the voltage $V_{HT}$ and connected to this latter by means of fusible links represented diagrammatically by the resistor 29. The cathode current is measured by the ammeter 31 and the voltage $V_{HT}$ can be measured and controlled by means of the voltmeter 33.

The device which has just been described with reference to FIG. 1 makes it possible to obtain transparent and conductive films of indium oxide doped by tin and suitable for use as transparent and conductive electrodes, especially in electronic charge-transfer devices and in liquid-crystal visual display devices. The present inventors have devoted a very complete experimental study to this device. The main originality of this study has consisted in following very precisely during the deposition process the variations which occur in the total pressure $p_T$ within the vacuum chamber as measured by means of the gage 5.

It has been found that, in the case of a given initial total pressure of a predetermined reactive mixture of argon and oxygen having a regulated flow rate and with a predetermined discharge voltage $V_A$, the variation in total pressure as a function of the target voltage $V_K$ is strictly reproducible. This is apparent from the set of curves of FIG. 2 which gives the drop in total pressure $\Delta_{p_T}$ expressed in $10^{-5}$ torr as a function of the target voltage $V_K$ expressed in volts, with a discharge voltage $V_A$ of 95 volts and a magnetic confinement field B of 72.5 gauss. Each curve corresponds to a given composition of the gas mixture, namely 11% oxygen and 89% argon in the case of curve I, 14% oxygen and 86% argon in the case of curve II, 20% oxygen and 80% argon in the case of curve III, 25% oxygen and 75% argon in the case of curve IV, 29% oxygen and 71% argon in the case of curve V.

Figure 2:
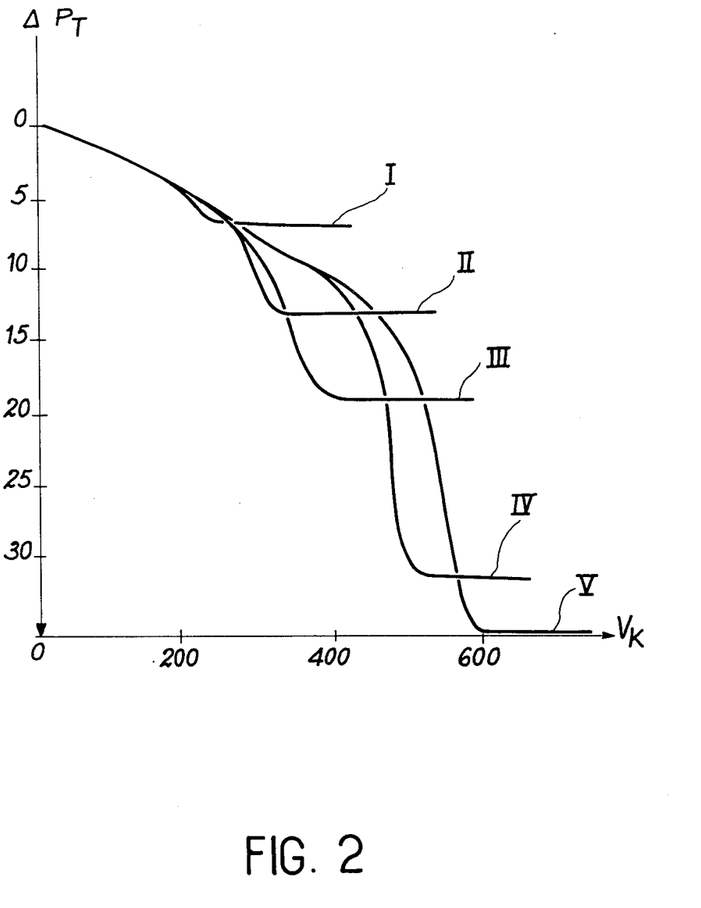
FIG. 2 shows a set of curves which give, for different compositions of the gas mixture, the variation of the total pressure drop during deposition as a function of the voltage applied to the target in the device of FIG. 1.

On each of these curves there can be distinguished three zones:

1 — in the case of low target voltages, there appears a transition zone and the total pressure decreases when the target voltage increases, that is, in a reproducible and reversible manner;

2 — an abrupt pressure drop then occurs;

3 — stabilization of the total pressure finally takes place at a bottom plateau.

The different curves which have been plotted all have the same shape. Progressive variation in the pressure drop $\Delta_{p_T}$ is characterized by a common transistion zone; abrupt drops appear at voltages of increasingly higher value and result in plateaus of progressively greater depth when the percentage of oxygen increases.

Figure 3:
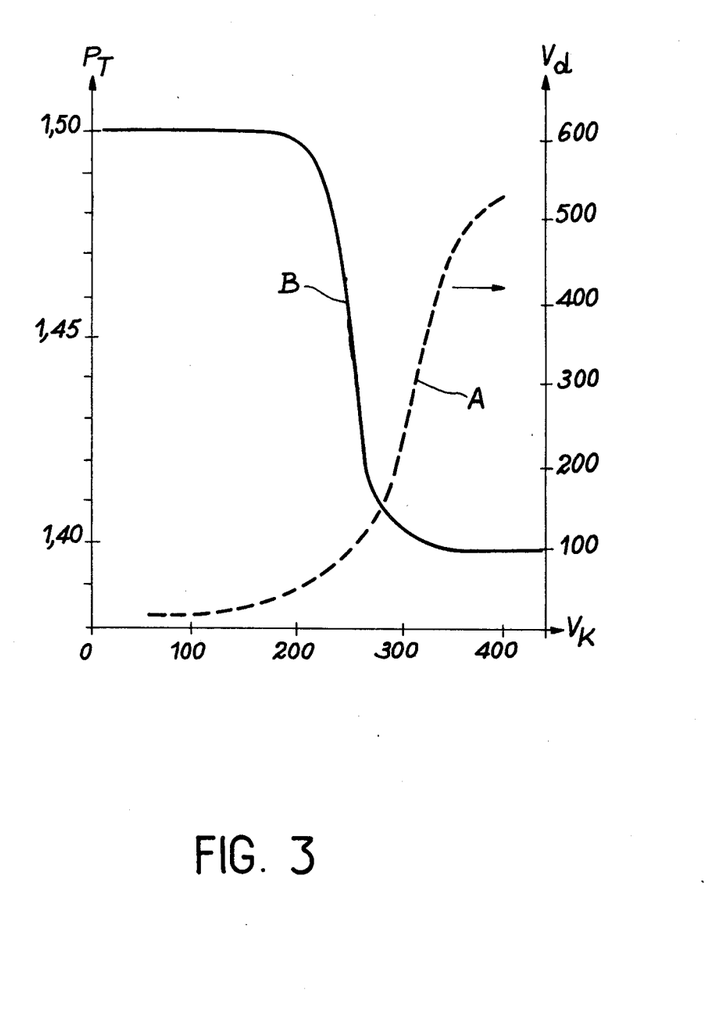
FIG. 3 shows the variations in total pressure and deposition rate for of a predetermined composition of gas mixture in the device of FIG. 1.

Furthermore, it is clear from FIG. 3 that the variations in total pressure are accompanied by variations in rate of deposition. Shown in this figure is curve (A) which gives the deposition rate $V_d$ in Å/min as a function of the voltage $V_K$ in the case of a discharge voltage $V_A$ of 120 volts and in the case of a gas mixture containing 14% oxygen and 86% argon.

In the same figure, there has been plotted the curve (B) which gives the total pressure $P_T$ expressed in $10^{-3}$ torr. It is apparent that, in the case of low pressure drops, the deposition rates are also low, which is characteristic of oxide sputtering on the target. In the bottom plateau or level pressure stage, the deposition rates are high and correspond to essentially metallic sputtering of the target: the deposition rates undergo an abrupt transition in the same zone as the total pressure undergoes an abrupt transition.

Figure 4:
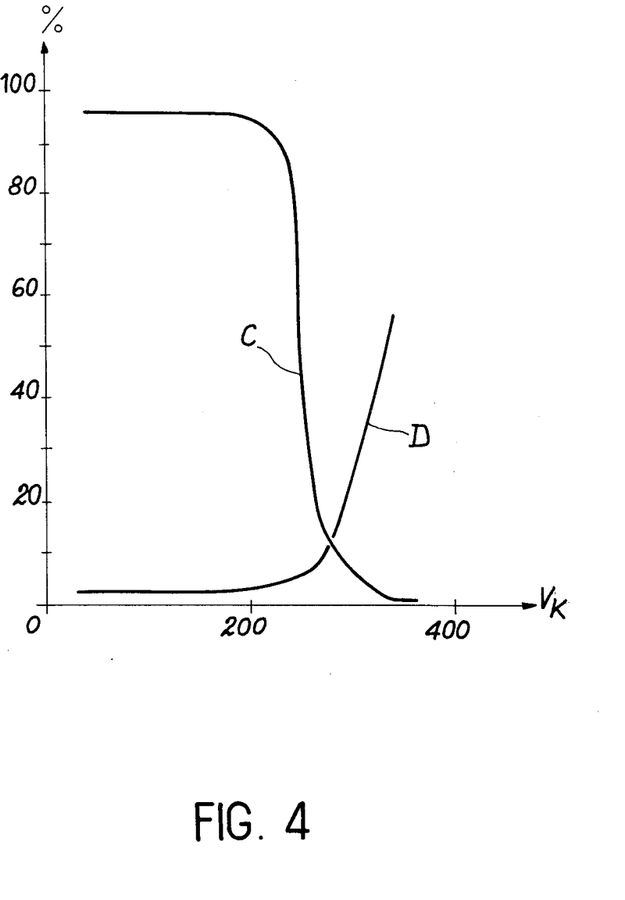
FIG. 4 shows the variations in optical properties of the films obtained by means of the device shown in FIG. 1 as a function of the voltage applied to the target during operation, for one composition of gas mixture.

Referring to FIG. 4, the optical properties of the films obtained will now be described. Measurements of transmission and reflection have been carried out on films having a thickness of 1200 Å deposited on polished sapphire. These films were obtained using a discharge voltage $V_A$ of 120 volts and a gas mixture containing 14% oxygen and 86% argon. Curve (C) represents the variation in percentage of incident light having a wavelength of 6000 Å which is transmitted through the film, as a function of the voltage $V_K$. Curve (D) also represents as a function of $V_K$ the variation in percentage of incident light having a wavelength of 6000 Å which is reflected by the film.

The variations in optical properties of the deposits as a function of the target voltage clearly show the dependence of their nature with this deposition parameter.

The low-voltage and low-rate films obtained are transparent in the visible and near infrared region of the spectrum (the transmission is higher than 90% in the case of the entire spectrum under study from 4000 to 25000 Å) and thus behave in the same manner as the stoichiometric oxide $In_2O_3$.

As the target voltage rises, the transmission becomes weaker and the absorption increases; the films have a dark and opaque appearance which denotes the presence of black oxide ($In_2O$) and oxygen depletion.

At the voltages corresponding to high deposition rates, the films obtained have a metallic optical behavior: reflection is intense and transmission is zero.

Figure 5:
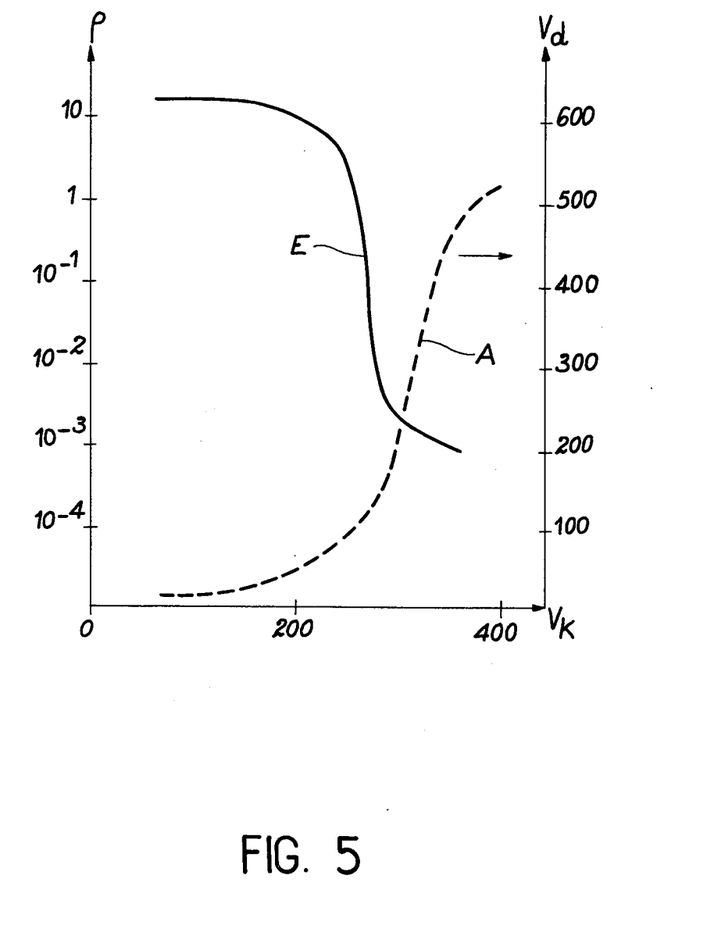
FIG. 5 shows the variations in resistivity of the films obtained by means of the device of FIG. 1 as a function of the voltage applied to the target during operation, for one composition of gas mixture.

The variation in resistivity of the films as a function of the target voltage $V_K$ is represented in FIG. 5 by the curve (E); the resistivity is expressed in $\Omega-cm$. The same figure shows the curve (A) which is identical with that of FIG. 3; the values of the different parameters are the same as in FIG. 3. The curve (E) has the same characteristics as those which describe the variations in deposition rate and in optical properties, that is to say, two level stages corresponding in one case to the low voltages and in the other case to the high voltages, said stages being separated by an abrupt transition. Transparent films deposited at a low rate exhibit high resistivity of approximately 10 $\Omega-cm$ whereas, in the high-voltage target zone, the films which have a metallic appearance and are obtained at a high deposition rate have resistivites of the order of $10^{-3} \Omega-cm$.

From all the observations made on the physical and electrical properties of films, it is possible to establish the relation which exists between the different experimental conditions as evidenced by the variation in pressure drop $\Delta_{p_T}$ and the stoichiometry of the deposited oxide; they also make it possible to determine beforehand both the deposition rate and the properties of films.

The reproducibility of the curves plotted in FIG. 2 in fact shows that it is only necessary to remain at a predetermined point on one of these curves in order to ensure that the conditions of deposition are maintained uniform in time. The curves of FIGS. 3, 4 and 5 also show that the deposition rate, the stoichiometry of the deposited film and the properties such as optical properties and resistivity which are related to the stoichiometry will then be determined. By modifying this operating point, the deposition rate and the properties of the deposited films will be modified at will.

The method in accordance with the invention is carried out in a number of steps which consist:

in evacuating the sputtering chamber to an initial pressure at a value $p_O$ by preliminary pumping;

in setting at a predetermined value all the parameters which are liable to exert an influence on sputtering of the target with the exception of the target voltage $V_K$, namely the filament heating voltage and current, the anode voltage $V_A$, the magnetic field B;

in setting the composition of the sputtering gas, namely the respective percentages of oxygen and argon, and the initial pressure $p_i$;

in establishing a reference value, namely either a value of pressure $p_d$, or a value of the derivative $\Delta p_d/\Delta V_K$, or a variation as a function of time $p_d(t)$;

in increasing $V_K$ so that the plasma forms and bombardment of the target begins; oxygen is consumed and the total pressure within the vacuum chamber decreases; the reference point is attained solely by varying or controlling the parameter $V_K$.

This method can be carried out manually by an operator who makes use of the pressure measurement and adjusts the target voltage $V_K$; the method will preferably be carried out automatically by means of a control system shown in FIG. 1. A digital computer of known type and generally designated as a microprocessor 35 receives at input 37 the pressure measurement signal delivered by the gage 5 at the output 21 of this latter and receives at another input 39 the measurement signal in respect of the target voltage $V_K$. The reference point signal is fed in at input 41. The microprocessor 35 delivers the signal for correcting $V_K$ at its output 43, said signal being applied to the generator 27 which delivers the voltage $V_{HT}$.

In the case of constant pressure control, the microprocessor 35 will make a simple comparison of the signal for the measurement of total pressure $p_T$ applied to its input 37 and the reference signal $p_d$ which is indicated at its input 41. The difference signal which is available at the output 43 will produce action on the generator 27 until it is reduced to zero.

In the case of pressure-variation control, the microprocessor 35 will first carry out a calculation of the derivative $\Delta p_T/\Delta V_K$ of the signal received at input 37 with respect to the signal which is received at input 39. It will compare the result with the reference signal $\Delta p_d/\Delta V_K$ which is fed in at input 41. The difference signal available at the output 43 will produce action on the generator 27 until nullification occurs.

It is worthy of note that, if the reference point falls within a zone of curves (I) to (V) in which these curves all coincide, it will not be necessary in order to obtain control of the deposition operation and of the characteristics of the deposited films to establish the proportion of reactive gases beforehand in a precise manner. Simplicity of operation is further enhanced in consequence thereof.

The advantages obtained by the invention are as follows:
  the nature of the films for a given operating point is strictly reproducible since the quantity of reactive gas consumed is regulated irrespective of the nature and proportion of the gases which are unintentionally present or intentionally introduced into the vacuum chamber and irrespective of any accidental variations in other possible electrical parameters (such as discharge current, magnetic field, filament current and voltage and so on);
  the operation of the deposition device is very simple;
  deposits in which either the stoichiometry or the nature (degree of oxidation, for example) may be defined beforehand can be obtained in a simple and reproducible manner.

Example of application: deposition of a transparent and conductive indium oxide film at a maximum sputtering rate.

In order to have a transparent oxide film ($In_2O_3$), it is necessary to ensure operation under conditions which are close to stoichiometry, namely in the portion of slow pressure drop with the voltage $V_K$ prior to the abrupt drop of $p_T$ which precedes the formation of a metallic and therefore opaque deposit.

In order to have low resistivity, the film must have oxygen vacancies and therefore be slightly sub-stoichiometric but not to an excessive degree since the suboxides of indium obtained would make the film opaque.

The mode of operation will now be explained, assuming that the equipment operates on the principle of triode sputtering. A target of pure indium is first fixed in position (it is also possible to make use of a target constituted by an alloy of indium with another metal such as tin, for example).

1 — Initial pumping: the starting vacuum Po is obtained by pumping to $5 \times 10^{-6}$ torr under atmosphere of argon.

2 — A flow rate of oxygen such that $Po + P_{O_2} = 2 \times 10^{-4}$ torr is set by means of the oxygen regulating valve.

3 — A flow rate of argon such that $Pi = Po + P_{O_2} + P_{Ar} = 1.5 \times 10^{-3}$ torr is set by means of the argon regulating valve.

In this case, the mixture within the vacuum chamber consists of 14% oxygen and 86% argon.

4 — The electrical parameters of filament current $I_f$, anode voltage and current ($V_A$ and $I_A$), current within the magnetic coils for producing a field B are adjusted in such a manner as to obtain a stable plasma in which, for example, $V_A = 95$ v, $B = 72.5$ gauss.

5 — $V_K$ is progressively increased until a variation in total pressure of $7 \times 10^{-5}$ torr is obtained. The pressure $P_t$ within the chamber is then $1.43 \times 10^{-3}$ torr and deposition takes place at the maximum rate $v_d$ which is compatible with the requisite quality of the deposit. In this example, $v_d = 80$ Å/min.

By producing action on $V_K$, it is accordingly necessary to maintain the pressure $P_t$ at a constant value equal to reference value $P_d$ throughout the deposition process.

A film deposited under these conditions will have a resistivity of 4 $\Omega$–cm and an optical transmissivity T < 90% throughout the visible spectrum. It will be noted that the resistivity can be reduced by thermal annealing without thereby modifying T to an appreciable extent.

By way of alternative, instead of establishing $V_A$ at a fixed value and producing a variation of $V_K$, it would also be possible to establish the value of the cathode supply $V_{HT}$ at 1300 volts, all other things being equal. This would result in a value of $V_K$ of approximately 220 volts at the operating point which is chosen and would also have the effect of varying $V_A$ until the variation in pressure of $7 \times 10^{-5}$ torr is obtained; this will be achieved in the case of a value $V_A$ in the vicinity of 95 volts.

The example given in the foregoing shows that the voltage $V_K$ is not the only parameter which it is possible to vary or control in order to carry the invention into effect.

In fact, the inventors have shown that it is possible in the triode sputtering devices to control the deposition by varying or controlling the target voltage, the target current, the anode-filament voltage, the anode-filament current, the voltage applied to the filament, or the current which flows within the filament.

In devices of the diode type, it is possible to modify the anode-target voltage and the anode-target current.

In devices of the "ion gun" type, it is possible to modify the potential of the ion source, the ion current delivered by the source and the potential of the accelerating grid.

In devices of the radio-frequency type, it is possible to modify the applied electromagnetic power, the target potential and the target current.

In all cases in which a magnetic confinement field is created within the chamber, it is also possible to modify the intensity of said field.

Finally, although the examples described in the foregoing relate to deposition of oxides by reactive sputtering, it is apparent that the invention applies to the deposition of other compounds such as nitrides, sulphides and the like. The basic concept employed in the invention is in fact that of equilibrium between consumption of reactive gas and the quantity of particles sputtered on the target.

What we claim is:

1. A method for controlling the deposition on a substrate of thin film layers comprising a compound formed of a chemical substance C and a reactive gas, which consists in placing within a chamber said substrate, a gas mixture containing said reactive gas and a target containing said substance C, the flow rate and the proportion of gases in the gas mixture being constant, producing a gas plasma containing ions and applying an electric field to said ions which are thus caused to bombard said target and to sputter said substance C so that the sputtered particles of substance C combine with said reactive gas so as to form said compound, wherein said method further consists in establishing all the bombardment parameters with the exception of one of the parameters governing the bombardment of the target by the ions, said one parameter being termed a regulation parameter, in varying said regulation parameter in order to initiate the deposition process, in measuring at each instant the total pressure drop within the chamber with respect to the initial pressure and in controlling said total pressure drop by controllably varying said regulation parameter.

2. A method according to claim 1, wherein said total pressure drop is maintained constant.

3. A method according to claim 1, wherein the derivative of the total pressure with respect to said regulation parameter is maintained constant.

4. A method according to claim 1, wherein said total pressure drop is controlled with respect to a reference value by controllably varying said regulation parameter.

5. A method according to claim 1, wherein said gas mixture is ionized by applying a voltage between an anode and said target, said regulation parameter being selected from the group of parameters consisting of the anode-target voltage, the anode-target current, and the intensity of the magnetic field applied to the chamber.

6. A method according to claim 1, wherein said gas mixture is ionized by applying a voltage between an emissive filament and an anode, the ions thus produced being accelerated towards the target by virtue of the potential to which said target is brought, said regulation parameter being selected from the group of parameters consisting of the filament heating current and voltage, the filament-electrode current and; voltage, the intensity of the magnetic field applied within the chamber, the target potential, and the target current.

7. A method according to claim 1, wherein the ions are produced within an enclosure which is separate from said chamber and accelerated by at least one accelerating grid in order to penetrate into said chamber and to bombard said target, said regulation parameter being selected from the group of parameters consisting of the ion source potential, the ion current delivered by the ion source, the accelerating grid potential, the target potential, and the intensity of the magnetic field applied within the chamber.

8. A method according to claim 1, wherein the ions are produced by applying alternating-current power preferably within the radio-frequency range to said gas mixture, said regulation parameter being selected from the group of parameters consisting of said alternating-current power applied to the intensity of the magnetic field which is applied to the chamber, the target potential, and the target current.

9. A vacuum sputtering device comprising a vacuum chamber which is adapted to contain the target to be sputtered and the substrate to be coated, means for introducing a given gas mixture into the chamber, means for producing ions, means for accelerating the ions produced to said target, wherein said device further comprises means for measuring the total pressure within the chamber and means for controlling said total pressure with respect to a reference value signal by controlling variation of one of the parameters governing the bombardment of the target by the ions, said parameter being designated as the regulation parameter.

10. A device according to claim 9, wherein said control means comprises a computer for receiving the measurement of pressure and the measurement of the regulation parameter, an input for receiving the reference value signal and generating a signal for correcting the regulation parameter.

* * * * *